(12) United States Patent
Nelson et al.

(10) Patent No.: US 8,370,719 B2
(45) Date of Patent: Feb. 5, 2013

(54) PERSISTENT MOVING READ REFERENCE

(75) Inventors: Scott Nelson, Vancouver (CA); Jonathan E. Schmidt, New Westminister (CA); Chun Fung Man, Vancouver (CA)

(73) Assignee: Intel Corporation, Santa Clara, CA (US)

( * ) Notice: Subject to any disclaimer, the term of this patent is extended or adjusted under 35 U.S.C. 154(b) by 258 days.

(21) Appl. No.: 12/784,616

(22) Filed: May 21, 2010

(65) Prior Publication Data

US 2011/0289388 A1 Nov. 24, 2011

(51) Int. Cl.
*G11C 29/00* (2006.01)
(52) U.S. Cl. ............... 714/773; 714/763; 365/185.09
(58) Field of Classification Search .............. 714/763, 714/773; 365/185.09
See application file for complete search history.

(56) References Cited

U.S. PATENT DOCUMENTS

| | | |
|---|---|---|
| 2007/0070696 A1 | 3/2007 | Avraham et al. |
| 2007/0091677 A1* | 4/2007 | Lasser et al. ............ 365/185.09 |
| 2009/0003058 A1 | 1/2009 | Kang |
| 2009/0003073 A1 | 1/2009 | Rizel et al. |
| 2009/0292969 A1 | 11/2009 | Man |
| 2009/0292970 A1 | 11/2009 | Man et al. |
| 2010/0182830 A1 | 7/2010 | Ryu et al. |
| 2011/0083039 A1 | 4/2011 | Kim et al. |

* cited by examiner

*Primary Examiner* — Sam Rizk
(74) *Attorney, Agent, or Firm* — Kacvinsky Daisak PLLC

(57) ABSTRACT

A device, method, machine-readable medium, and system are disclosed. In one embodiment the device is a memory controller capable of modifying a reference voltage to a persistent moving read reference (MRR) voltage level for use during one or more subsequent reads to a non-volatile memory array. This modification is in response to a change in a reference voltage supplying the non-volatile memory array from a previous reference voltage level to a temporary MRR voltage level.

24 Claims, 3 Drawing Sheets

PERSISTENT MOVING READ REFERENCE

FIELD OF THE INVENTION

The invention relates to non-volatile memory storage systems. More specifically, the invention relates to using a persistent moving read reference voltage for non-volatile memory storage.

BACKGROUND OF THE INVENTION

Non-volatile memory (NVM) storage is very popular in the computer industry and the electronics industry. Computers have long utilized NVM storage for basic input/output system (BIOS) code storage and other important boot routines. But, more recently, the usage models for NVM storage have expanded greatly from digital camera image storage to digital music player storage of songs. NVM devices have dramatically decreased in size and increased in storage capacity. Now the computer industry is beginning to build solid state drives (SSDs) utilizing NVM devices for mass storage. SSDs may someday completely replace conventional hard disk drives due to in part to superior performance, smaller profiles, and lower power requirements.

One long known detriment to NVM devices has been their finite lifespan. Unlike their volatile memory counterparts, the circuitry within NVM devices deteriorate over time. Due to this deterioration, the reference voltage required to effectively read NVM devices may change over time. Additionally, data stored within NVM devices may degrade after some data retention time. Although this aging characteristic of NVM devices does not happen at nearly the rate it does for volatile memory, data retention is still a factor when using NVM.

BRIEF DESCRIPTION OF THE DRAWINGS

The present invention is illustrated by way of example and is not limited by the drawings, in which like references indicate similar elements, and in which.

DETAILED DESCRIPTION OF THE INVENTION

Embodiments of a method, device, and system, to implement a persistent moving read reference voltage for non-volatile memory are described.

A computer system may include a non-volatile memory (NVM) storage subsystem. In many embodiments, the NVM storage subsystem may be a solid state drive (SSD). In other embodiments, the NVM storage subsystem may be utilized for a different purpose than a general purpose storage drive. The NVM storage subsystem includes one or more NVM devices. For example, there may be several NAND flash memory devices that create a storage array within the NVM storage subsystem. Due to the nature of an NVM device, the voltage required to successfully read any given portion of the device will evolve over time. In other words, a device will degrade over time and this may cause a change in the necessary voltage used to read the device over that time span.

Currently, a moving read reference (MRR) voltage solution helps in elongating the lifespan of an NVM device by allowing the voltage to compensate by utilizing error checking and correction (ECC) feedback data to adjust the voltage to minimize errors. This MRR voltage adjustment takes extra time for reads because of the feedback loop utilized. For a given ECC failure on a read, the voltage is adjusted and then tried again, which may or may not lead to additional ECC failures and further adjustment. The MRR process of testing a voltage for ECC errors is iterative and thus may cause memory controller delays to complete a read.

When manufactured, the reference voltages for a NVM device are initially configured by taking into account an expected usage model and anticipating how the required voltage used for reads will evolve over time. But usage patterns for individual devices vary from the expected model. Also, the response of a NVM device to the usage pattern may vary from what was predicted. Systematic changes from the expected voltage distribution may be compensated by using data from past MRR invocations to predict what voltage reference level would least likely cause MRR invocations on future reads. This is referred to as persistent MRR.

Figure 1:
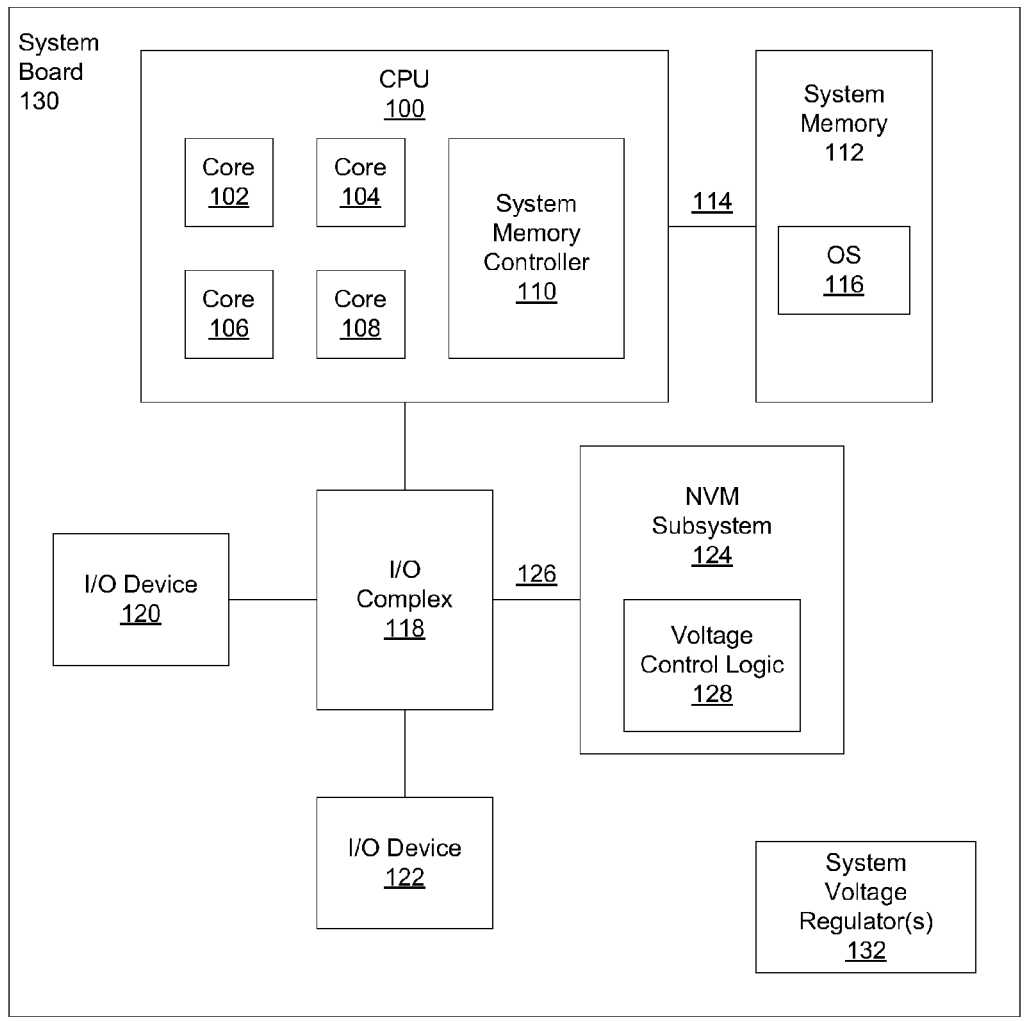
FIG. 1 illustrates an embodiment of a computer system including a non-volatile memory storage system using persistent moving read reference voltage.

FIG. 1 illustrates an embodiment of a computer system including a non-volatile memory storage system using persistent moving read reference voltage.

The computer system includes one or more central processing units (CPUs), such as CPU 100. In many embodiments, CPU 100 is an Intel® Corporation CPU. In other embodiments, CPU 100 is another brand CPU. CPU 100 includes one or more processor cores, such as cores 102, 104, 106, and 108. Each core includes one or more execution units, retirement units, a number of storage registers, potentially one or more cache memories, as well as other circuitry that generally resides within a CPU core. CPU 100 also may include a system memory controller 110 to control communication with a system memory 112. A system memory interconnect 114 (i.e., a bus, a link, etc.) communicatively couples the system memory 112 with CPU 100. The interconnect 114 may include lines to transport address, data, control and clock information between CPU 100 and system memory 112. Although system memory controller 110 resides within CPU 100 in FIG. 1, in other embodiments that are not shown, system memory controller 110 may reside in a separate integrated circuit, discrete from CPU 100, in the computer system.

System memory 112 may be a dynamic random access memory (DRAM) in many embodiments. For example, system memory 112 may be a form of double data rate (DDR) synchronous DRAM. System memory 110 may store instructions and data to be executed by the CPU 100. For example, system memory 110 may store an operating system (OS) 116 during the operation of the computer system.

In many embodiments, CPU 100 is communicatively coupled to an I/O (input/output) complex 118. The I/O complex 118 may include one or more I/O controllers (not shown) that allow the computer system to communicate with one or more I/O devices (such as devices 120 and 122). For example, I/O complex 118 might include a universal serial bus (USB) controller and I/O devices 120 and 122 may be USB devices.

In many embodiments, the I/O complex 118 is also coupled to a non-volatile memory (NVM) subsystem 124. The NVM subsystem 124 includes at least one or more non-volatile memory devices. In different embodiments, the NVM devices may include certain types of flash memory such as NAND and NOR-based devices, phase change memory (PCM), electrically erasable programmable read only memory (EEPROM), or one or more other types of NVM.

The NVM devices may store data that is not contingent upon power being supplied to the NVM subsystem. Thus, during computer system reset sequences, power down and up sequences, as well as any other sequence that may cycle the power to the computer system, the NVM subsystem can continue to store data in the one or more devices. This is opposed to the system memory 112, which requires power to store data. Any data stored in the system memory 112 during a reset or power cycling sequence would be lost if not saved elsewhere during the sequence. In many embodiments, the NVM subsystem 124 comprises a solid-state drive (SSD).

The NVM subsystem 124 is communicatively coupled to the computer system by way of an interconnect 126. Interconnect 126 comprises one or more lines that are utilized to transmit data, address, control, and other signals. In some embodiments, the lines may comprise copper wires. In other embodiments, the lines may comprise another metal or alloy, optical lines, or another medium utilized to transmit information.

In many embodiments, interconnect 126 communicatively couples the NVM subsystem 124 with the I/O complex (component 118 in FIG. 1). However, in other embodiments, interconnect 126 may communicatively couple the NVM subsystem 124 with another integrated circuit component within the computer system.

The NVM subsystem 124 includes voltage control logic 128 in many embodiments. The voltage control logic 128 controls voltage to the NVM subsystem 124, which includes the implementation of a temporary MRR and persistent MRR voltage reference for memory reads. The NVM subsystem is described in detail in FIG. 2 and the temporary MRR and persistent MRR operation is described in detail in FIG. 3.

In many embodiments, the CPU 100, system memory 112, and NVM subsystem 124 are all coupled commonly to a system board 130. The system board 130 (e.g., a motherboard) routes wire traces for communication among components on the board as well as for delivery of power to those components. The system board 130 includes one or more voltage regulators 132 that regulate the voltage supplied to the components. For example, the system voltage regulators supply a certain voltage to the different subsystems in the computer system, including to the NVM subsystem 124 and the voltage control logic 128.

Figure 2:
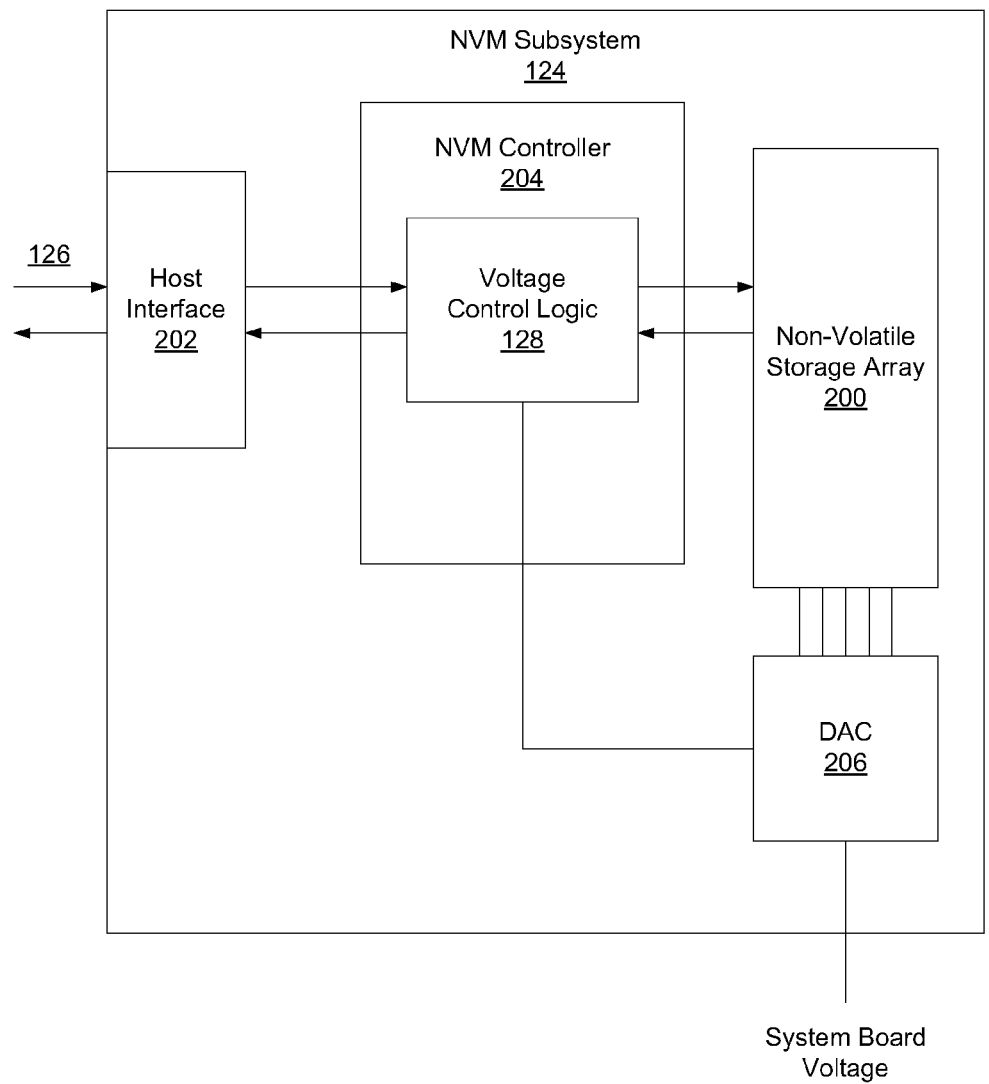
FIG. 2 illustrates a detailed view of an embodiment of the NVM subsystem using persistent moving read reference voltage.

FIG. 2 illustrates a detailed view of an embodiment of the NVM subsystem using persistent moving read reference voltage.

The NVM subsystem includes non-volatile storage array 200. In different embodiments, the storage may be flash memory or another form of memory storage that is non-volatile. For example, the storage may comprise one or more NAND devices. In other embodiments, the non-volatile storage array 200 may comprise NOR devices, PCM, an EEPROM, or another type of NVM. In many embodiments, the non-volatile storage array includes one or more NVM devices and the devices are each sub-divided into a number of sectors.

The NVM subsystem 124 may include a host interface 202. The host interface 202 is the communication interface between the NVM subsystem 124 and the remainder of the computer system. For example, communication between a host CPU, such as CPU 100 in FIG. 1, and the NVM subsystem 124 may take place through the host interface 202. Read and write requests from CPU 100 may be routed through the host interface 202 into the NVM subsystem 124. In many embodiments, the host interface 202 includes one or more buffers that can store several read and write requests entering the NVM subsystem 124. The buffers may be in the form of queues, such as first-in first-out (FIFO) queues, which may store requests that enter the NVM subsystem 124.

The host interface 202 may receive host requests, such as read and write requests, and then forward them to an NVM controller 204. The NVM controller 204 may process the requests and write to or read from the non-volatile storage array 200.

Non-volatile storage array 200 has a finite lifespan due to write wearing of the NVM storage devices that comprise the array. When data is written to an NVM device within non-volatile storage array 200, the process of writing to one or more of the sectors that make up the storage will eventually create wear effects in those sectors. Specifically, when a write request is processed by NVM, the control logic erases data within one or more sectors in the array and then writes in the new data to complete the write process. When the devices begin to wear, the voltage required to effectively read those devices without incurring too many ECC errors changes. A low quantity of errors is tolerable because some errors can be corrected. But too many ECC errors becomes an uncorrectable amount and is deemed ECC fatal. Thus, in many embodiments, the voltage is modified over the course of the life of a device. Though, many manufacturers utilize an expected usage model to predict the evolution of the change in voltage required over time, it is inherently unpredictable for a given part since each part has a unique usage history. Additionally, as discussed above, NVM storage devices also have aging issues with data retention, which can also eventually cause ECC errors.

The NVM controller 204 includes the voltage control logic 128, discussed in FIG. 1. A digital to analog (DAC) 206 supplies a read reference voltage to the non-volatile storage array 200. In different embodiments, the DAC 206 (or multiple DACs) may have the ability supply separate voltages to different segments of the non-volatile storage array 200. The granularity of the segments can be at different sizes in different embodiments. The finer the granularity (the more segments) requires more DAC logic, voltage control logic, and separate voltage supply wires, though it allows a more customizable voltage supply scenario across different portions of the array. The voltage control logic 128 has the ability to cause the DAC 206 to modify the supplied voltage to one or more segments of the non-volatile storage array 200.

The voltage control logic 128 has access to ECC data that is calculated for each read to the non-volatile storage array 200. There are different levels of severity for a given error found by the ECC calculation. Errors may either be recoverable, in which case the ECC corrects the error and the read succeeds, or non-recoverable, in which case the ECC calculation fails and a MRR voltage modification would be attempted to correct the error(s).

The MRR voltage modification comes in two forms. A temporary MRR modification attempts to find a voltage level for just the current read command for the non-volatile memory location. Once a voltage level that allows for a successful read (i.e. with no ECC failures) is found, the current read completes and then the voltage returns to the previous reference voltage level that potentially caused the ECC failure in the first place. If the non-volatile memory has degraded and continues to have these errors, the temporary MRR voltage modification may have to be done each time there is a read. Thus, it is beneficial to have a persistent MRR to permanently move the reference voltage toward a more stable value for subsequent reads after the failed read.

Therefore a dual loop MRR algorithm to temporarily adjust the reference voltage to recover from the initial read ECC error may be coupled with a persistent MRR algorithm to attempt to eliminate further read ECC failures. In the most simple form, a persistent MRR voltage adjustment adjusts the reference voltage for future reads to the voltage level determined during the temporary MRR adjustment. Thus, if the voltage level is increased by two steps (increments) by the DAC 206 to get a non-failed ECC calculation during the implementation of the temporary MRR algorithm, then the persistent MRR voltage modification adjusts the permanent voltage those same two steps. "Permanent" does not necessarily mean that the modified voltage level is entirely permanent, rather the modified voltage level is permanently changed to the new level until the next ECC failure, when the calculations are done again to obtain a next persistent MRR voltage level. In certain embodiments, there may be storage within or accessible to the voltage control logic 128 that allows the persistent MRR voltage level to retain as the "permanent" new voltage level through system power cycles/boots.

The temporary MRR voltage level is arrived at by an iterative testing process where the read that failed is repeated at a different voltage level. The voltage is stepped up or down, depending on the search algorithm. In fact, in some search algorithms, the entire range of possible voltages is stepped through for testing purposes. In these algorithms, the middle of an acceptable range of voltages is taken for the temporary MRR voltage level. In other embodiments, as soon as a successful read completes without an ECC failure, that voltage level is used.

In many embodiments, a history of successful and failed MRR adjustment attempts is kept by the voltage control logic. Additionally, in many embodiments, this history is kept per page or perhaps per block (multiple pages), or perhaps per device. The finer the granularity the history is kept, the more precise the information is for portions of the device, which may be helpful since non-volatile memory devices may fail at different rates on different portions of the device. Another possible piece of information to be utilized may be the type of non-volatile device, since device type may play into the known factors at how devices fail over time.

In any event, some or all of this information may be saved by the voltage control logic 128 for use when determining the persistent MRR recovery algorithm. The persistent MRR recovery algorithm may consider all temporary MRR recovery results and past history of successful and non-successful reads when determining what to set the persistent MRR voltage level at.

Figure 3:
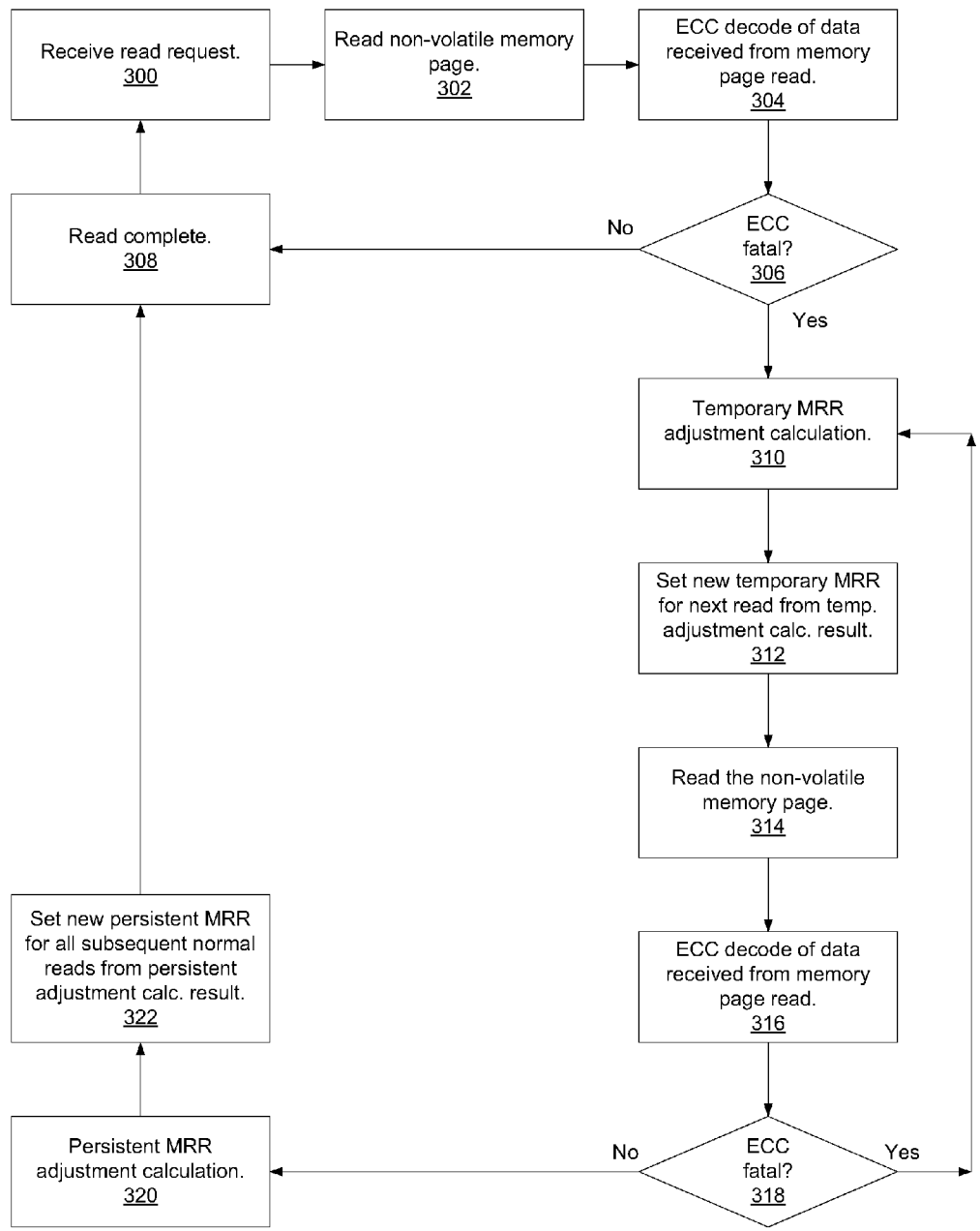
FIG. 3 is a flow diagram of an embodiment of a process to implement a persistent moving read reference voltage modification algorithm.

FIG. 3 is a flow diagram of an embodiment of a process to implement a persistent MRR voltage modification algorithm.

The process may be performed by processing logic that may comprise hardware, firmware, software, or a combination of any of the above. The process begins by processing logic in the non-volatile memory controller receiving a read request to access a location in non-volatile memory (processing block 300). The read request is processed by the memory controller logic, which issues a read to a non-volatile memory page (processing block 302).

The read completes and ECC logic within the memory controller decodes the data received from the memory page read to determine if there is an error (processing block 304). The results of the ECC decode are determined and processing logic checks to see if the ECC had a fatal error (processing block 306). If the ECC was not fatal (either there was no ECC error at all or the ECC error was recoverable), then processing logic determines that the read request is complete (processing block 308) and the process is done until the next read request.

On the other hand, if the ECC was fatal, then processing logic within the memory controller (such as voltage control logic 128 in FIG. 1) does a temporary MRR adjustment calculation (processing block 310). This adjustment calculation has been described in various forms. Once the temporary MRR voltage level has been determined, processing logic sets the new temporary MRR voltage level for the next read (processing block 312). Processing logic in the memory controller then attempts to read the non-volatile memory page (processing block 314). And again processing logic then decodes the ECC from the read (processing block 316).

Next processing logic determines whether the ECC for this subsequent read was fatal (processing block 318). If so, then processing logic returns to block 310 to attempt another temporary MRR adjustment. Otherwise, if successful, processing logic then calculates for the persistent MRR voltage level (processing block 320).

As stated above, the persistent MRR calculation may take into account many factors. One factor is the page the failure occurred upon. With page information, it is possible to determine whether a particular page has gone bad and is an outlier among all the other pages or at least some of the pages close to the bad page. If this page is not behaving in a similar fashion to other pages, the persistent MRR may not change the permanent reference voltage level at all since a change to compensate for the single bad page may cause failures to all the other pages on the same power plane (i.e., supplied by the same DAC). Thus, it is possible that only when a significant number of adjacent or relatively close proximity pages begin to fail that persistent MRR takes effect.

Another factor may be the type of memory that the failure is taking place upon. Different memories exhibit different failure patterns over the course of the life of the memory device. Thus, prior knowledge of these standard patterns may complement a persistent MRR calculation.

An additional factor may be information from a histogram of failures to the pages. If pages in a general vicinity are having ECC failures, the persistent MRR calculation may just take a saved previous persistent MRR calculation of an adjacent page and utilize that since adjacent pages are likely to exhibit similar failure issues.

It is also likely that past history of the specific page in question may be saved. Thus, if the page is deteriorating at a steady rate, the voltage required to alleviate the deterioration may also change at the same steady rate and projected voltage for future successful ECC calculations may be predictable.

The recovery algorithm calculation may also use different levels of steps in voltage toward a predicted successful voltage. For example, the persistent MRR voltage level utilized may be at the middle of a range of predicted successful reference voltage levels for a given read on the device. On the other hand, because more than one page most likely will be affected by the change in voltage, the utilized persistent MRR may be a voltage level that is a fraction along the delta between the previous voltage level that caused the ECC failure and the predicted optimal voltage level for the given page.

Many other adjustment factors may be saved over the course of time to generate a precise algorithm for future persistent MRR calculations. These factors are simply examples of the many possible factors that may be utilized in setting a persistent MRR voltage level.

Returning to FIG. 3, once the persistent MRR adjustment calculation has been completed, processing logic then sets the new persistent MRR voltage level for all subsequent normal reads (processing block 322). The nature of the algorithm in FIG. 3 shows that the persistent MRR voltage level is used for all subsequent reads to the particular page until another ECC failure occurs at that page, at that point the algorithm is processed again, which eventually leads to a new persistent MRR voltage level.

Elements of embodiments of the present invention may also be provided as a machine-readable medium for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, propagation media or other type of machine-readable media suitable for storing electronic instructions. For example, embodiments of the invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the description above and in the claims, the terms "include" and "comprise," along with their derivatives, may be used, and are intended to be treated as synonyms for each other. In addition, in the following description and claims, the terms "coupled" and "connected," along with their derivatives may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate, interact, or communicate with each other.

In the description above, certain terminology is used to describe embodiments of the invention. For example, the term "logic" is representative of hardware, firmware, software (or any combination thereof) to perform one or more functions. For instance, examples of "hardware" include, but are not limited to, an integrated circuit, a finite state machine, or even combinatorial logic. The integrated circuit may take the form of a processor such as a microprocessor, an application specific integrated circuit, a digital signal processor, a microcontroller, or the like.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

We claim:

1. A memory controller operable to:
cause a change in a reference voltage supplied to a page of a non-volatile memory array from a previous reference voltage level to a temporary moving read reference (MRR) voltage level in response to an error checking and correction (ECC) decode failure of a previous read of the page using the previous reference voltage level;
determine a persistent MRR voltage level based on a relative proximity of the page to one or more other pages of the non-volatile memory array that had a similar ECC decode failure of a previous read of the one or more other pages using the previous reference voltage level; and
cause the reference voltage to be modified to the persistent MRR voltage level based on the determination, the persistent MRR voltage level for use during one or more subsequent reads to the page.

2. The memory controller of claim 1, wherein the temporary MRR voltage level is the same as the persistent MRR voltage level.

3. The memory controller of claim 1, wherein a voltage delta between the temporary MRR voltage level and the previous reference voltage level is larger than a voltage delta between the persistent MRR voltage level and the previous reference voltage level.

4. The memory controller of claim 1, wherein the memory controller is further operable to:
cause a digital to analog converter supplying the reference voltage to the page of the non-volatile memory array to change the supplied reference voltage in one or more voltage level increments.

5. The memory controller of claim 1, wherein to cause the reference voltage to be modified to the persistent MRR voltage comprises the reference voltage to be modified to match at least one persistent MRR voltage in use by the one or more other pages that had the similar ECC decode failure.

6. The memory controller of claim 1, wherein the persistent MMR voltage level is also determined based on a type of memory for the non-volatile memory array.

7. The memory controller of claim 6, wherein the type of memory includes at least one of NAND flash memory, NOR flash memory, phase change memory or electrically erasable read only memory.

8. A method, comprising:
modifying a reference voltage to a persistent moving read reference (MRR) voltage level for use during one or more subsequent reads to a page of a non-volatile memory array in response to an error checking and correction (ECC) decode failure of a previous read of the page array using a previous reference voltage level that causes a change in the reference voltage supplied to the page from the previous reference voltage level to a temporary MRR voltage level, the persistent MRR determined based on a relative proximity of the page to one or more other pages of the non-volatile memory array that had a similar ECC decode failure of a previous read of the one or more other pages using the previous reference voltage level.

9. The method of claim 8, wherein the temporary MRR voltage level is the same as the persistent MRR voltage level.

10. The method of claim 8, wherein a voltage delta between the temporary MRR voltage level and the previous reference voltage level is larger than a voltage delta between the persistent MRR voltage level and the previous reference voltage level.

11. The method of claim 8, further comprising:
causing a digital to analog converter supplying the reference voltage to the page of the non-volatile memory array to change the supplied reference voltage in one or more voltage level increments.

12. The method of claim 8, wherein causing the reference voltage to be changed to the persistent MRR voltage comprises the reference voltage to be changed to match at least one persistent MRR voltage in use by the one or more other pages that had the similar ECC decode failure.

13. The method of claim 8, wherein the persistent MMR voltage level is also determined based on a type of memory for the non-volatile memory array.

14. The method of claim 13, wherein the type of memory includes at least one of NAND flash memory, NOR flash memory, phase change memory or electrically erasable read only memory.

15. A machine-readable medium having stored thereon instructions, which if executed by a machine causes the machine to perform a method comprising:
modifying a reference voltage to a persistent moving read reference (MRR) voltage level for use during one or more subsequent reads to a page of a non-volatile memory array in response to an error checking and correction (ECC) decode failure of a previous read of the page array using a previous reference voltage level that causes a change in the reference voltage supplied to the page from the previous reference voltage level to a temporary MRR voltage level, the persistent MRR determined based on a relative proximity of the page to one or more other pages of the non-volatile memory array that had a similar ECC decode failure of a previous read of the one or more other pages using the previous reference voltage level.

16. The machine-readable medium of claim 15, wherein the temporary MRR voltage level is the same as the persistent MRR voltage level.

17. The machine-readable medium of claim 15, wherein a voltage delta between the temporary MRR voltage level and the previous reference voltage level is larger than a voltage delta between the persistent MRR voltage level and the previous reference voltage level.

18. The machine-readable medium of claim 15, wherein the method further comprises:
causing a digital to analog converter supplying the reference voltage to the page of the non-volatile memory array to change the supplied reference voltage in one or more voltage level increments.

19. The machine-readable medium of claim 15, wherein causing the reference voltage to be changed to the persistent MRR voltage comprises the reference voltage to be changed to match at least one persistent MRR voltage in use by the one or more other pages that had the similar ECC decode failure.

20. The machine-readable medium of claim 15, wherein the persistent MMR voltage level is also determined based on a type of memory for the non-volatile memory array, the type of memory to include at least one of NAND flash memory, NOR flash memory, phase change memory or electrically erasable read only memory.

21. A system, comprising:
a NAND memory array: and
a memory controller operable to:
cause a change in a reference voltage supplied to a page of the NAND memory array from a previous reference voltage level to a temporary memory read reference (MRR) voltage level in response to an error checking and correction (ECC) decode failure of a previous read of the page using the previous reference voltage level;
determine a persistent MRR voltage level based on a relative proximity of the page to one or more other pages of the NAND memory array that had a similar ECC decode failure of a previous read of the one or more other pages using the previous reference voltage level; and
cause the reference voltage to be modified to a persistent MRR voltage level for use during one or more subsequent reads to the NAND memory array.

22. The system of claim 21, wherein the temporary MRR voltage level is the same as the persistent MRR voltage level.

23. The system of claim 21, wherein a voltage delta between the temporary MRR voltage level and the previous reference voltage level is larger than a voltage delta between the persistent MRR voltage level and the previous reference voltage level.

24. The system of claim 21, wherein to cause the reference voltage to be modified to the persistent MRR voltage comprises the reference voltage to be modified to match at least one persistent MRR voltage in use by the one or more other pages that had the similar ECC decode failure.

* * * * *

UNITED STATES PATENT AND TRADEMARK OFFICE
CERTIFICATE OF CORRECTION

| | | |
|---|---|---|
| PATENT NO. | : 8,370,719 B2 | Page 1 of 1 |
| APPLICATION NO. | : 12/784616 | |
| DATED | : February 5, 2013 | |
| INVENTOR(S) | : Scott Nelson et al. | |

It is certified that error appears in the above-identified patent and that said Letters Patent is hereby corrected as shown below:

In the Claims

In column 8, line 40, in claim 6, delete "MMR" and insert -- MRR --, therefor.

In column 9, line 11, in claim 13, delete "MMR" and insert -- MRR --, therefor.

In column 10, line 9, in claim 20, delete "MMR" and insert -- MRR --, therefor.

Signed and Sealed this
Fourteenth Day of May, 2013

Teresa Stanek Rea
*Acting Director of the United States Patent and Trademark Office*